United States Patent [19]
Lur et al.

[11] Patent Number: 5,384,268
[45] Date of Patent: Jan. 24, 1995

[54] CHARGE DAMAGE FREE IMPLANTATION BY INTRODUCTION OF A THIN CONDUCTIVE LAYER

[75] Inventors: Water Lur, Taipei; Ben Chen, Hsin-Chu; Cheng H. Huang, Hsin Chu, all of Taiwan, Prov. of China

[73] Assignee: United Microelectronics Corporation, Hsin Chu, Taiwan, Prov. of China

[21] Appl. No.: 7,713

[22] Filed: Jan. 22, 1993

[51] Int. Cl.[6] .................................. H01L 21/265
[52] U.S. Cl. .................................. 437/20; 437/43
[58] Field of Search .................................. 437/20, 43

[56] References Cited

U.S. PATENT DOCUMENTS

| | | | |
|---|---|---|---|
| 4,407,851 | 10/1983 | Kurosawa et al. | 427/39 |
| 4,774,204 | 9/1988 | Havenmann | 437/54 |
| 5,030,579 | 7/1991 | Calviello | 437/22 |
| 5,037,767 | 8/1991 | Daniel | 437/28 |
| 5,061,644 | 10/1991 | Yue et al. | 437/31 |
| 5,075,240 | 12/1991 | Yama et al. | 437/20 |
| 5,290,711 | 3/1994 | Yanagisawa | 437/20 |
| 5,302,549 | 4/1994 | Santangelo et al. | 437/20 |

FOREIGN PATENT DOCUMENTS 1244614  9/1989  Japan .

OTHER PUBLICATIONS

Wolf et al, Silicon Procesing for the VLSI Era, Lattice Press, 1990.

*Primary Examiner*—Brian E. Hearn
*Assistant Examiner*—Lynne A. Gurley
*Attorney, Agent, or Firm*—George O. Saile

[57] ABSTRACT

A method is described for fabricating an integrated circuit in which the gate electrodes and gate dielectric silicon oxide are protected from electrical charge damage during ion implantation. A thin conducting layer is deposited over the pattern of gate electrodes/gate dielectric silicon oxide wherein the conducting layer is grounded to the silicon substrate. The high-dose ion implantation is applied through the conducting layer which layer grounds the electrical charge resulting from the ion implantation, and hence protects the gate electrodes from charge damage. The electron "flood gun" need not be used.

26 Claims, 2 Drawing Sheets

CHARGE DAMAGE FREE IMPLANTATION BY INTRODUCTION OF A THIN CONDUCTIVE LAYER

BACKGROUND OF THE INVENTION

(1) FIELD OF THE INVENTION

The present invention relates to the fabrication of integrated circuit devices, and more particularly, to a method of ion implantation which prevents electrical charge damage to the device structures of the integrated circuit.

(2) DESCRIPTION OF THE PRIOR ART

Conventional high-dose ion implantation is performed after a thin oxide formation, the purpose of which is to avoid ion channeling effects as well as in-process contamination. Such protective layers are described in U.S Pat. No. 5,061,644 to Jerry Yue et al U.S. Pat. No. 5,037,767 P.J Daniel describes ion implantation through a resist layer U.S. Pat. No. 5,030,57 to Calviello uses a mask of preferably silicon oxide.

The implanted ions are always charged so that they can be accelerated to the appropriate energies before reaching the wafers. However, the charging on the gate polysilicon electrode causes an enormous electrical field on the gate dielectric silicon oxide which can result in damage to the gate dielectric silicon oxide, a non-uniform dose of ions across the wafer, dosage accuracy problems, and "explosion" of photoresist masking layer.

For example, a typical source/drain (S/D) implant dose is 2 to $7 \times 10^{15}$ per cm$^2$ and a typical gate oxide thickness is less than 200 Angstroms for devices with submicron feature sizes. During the S/D implantation, the gate polysilicon is isolated by the gate oxide and spacers from the grounded substrate. The electrical field across the gate oxide can be derived as follows:

$$V = Q/C$$

where V is the voltage, Q is the charge, and C is the capacitor.

$$C = (4 \text{ pi } ee_o A)/t_{ox}$$

where $ee_o$ is the dielectric constant of oxide, A is the gate area, and $t_{ox}$ is the gate dielectric silicon oxide thickness. Then, the electrical field (E) across the gate dielectric silicon oxide will be $$E = V/t_{ox}$$

and then $$E = Q/(4 \text{ pi } ee_o A)$$

Substituting the parameters into the formulas, $Q/A = 1.6 \times 10^{-19}$ Coul $\times 5 \times 10^{15}$/cm$^2$, $ee_0 = 3.9 \times 8.85 \times 10^{-14}$ F/cm, and F=Coul/Volt, the result is:

$$E = 1.84 \times 10^8 \text{ Volt/cm} = 184 \text{ MV/cm}.$$

This value is much higher than the gate dielectric silicon oxide can endure. The normal breakdown field for a gate dielectric silicon oxide is less than 20 MV/cm. This huge electric field will cause serious damage to the gate oxide even if there is some thermal recovery process after ion implantation. In an effort to resolve the charging problem, an electron "flood gun" has been used during ion implantation to neutralize the ions before their arrival at the wafer. However, the "flood gun" cannot neutralize all the ions and some charge damages still occur.

SUMMARY OF THE INVENTION

Accordingly, it is a primary object of the invention to provide a process for ion implantation which protects, for example, the gate electrode and gate dielectric silicon oxide in a MOSFET; the gate electrode, floating gate electrode, gate dielectric, and interpoly dielectric of an EPROM; or similar types of devices from all electrical charge damage.

A method is described for fabricating an integrated circuit in which the gate electrodes and gate dielectric silicon oxide are protected from electrical charge damage during ion implantation. A thin conducting layer is deposited over the pattern of gate electrodes/gate dielectric silicon oxide wherein means provide the conducting layer to be grounded to the silicon substrate. The high-dose ion implantation is applied through the conducting layer which layer grounds the electrical charge resulting from the ion implantation, and hence protects the gate electrodes from charge damage. The electron "flood gun" need not be used.

BRIEF DESCRIPTION OF THE DRAWINGS

In the accompanying drawings forming a material part of this description, there is shown.

DESCRIPTION OF THE PREFERRED EMBODIMENTS

Figure 1:
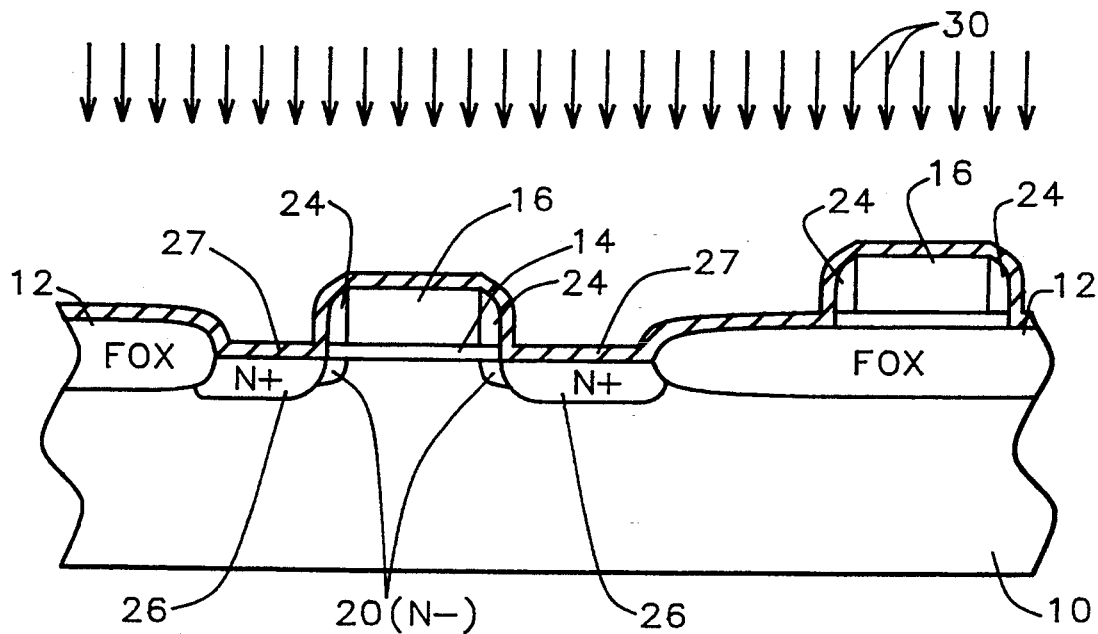
FIG. 1 is a cross-sectional representation of one preferred embodiment of the present invention.

Referring now more particularly to Fig. 1, there is shown a semiconductor substrate 10, preferably composed of silicon having a (100) crystallographic orientation. In an effort to simplify the description and the drawings the dielectric isolation between devices has been only partially shown and will not be described in detail, because they are conventional. For example, one method is described by E. Kooi in his U.S. Pat. No. 3,970,486 wherein certain selected surface portions of a silicon semiconductor substrate is masked against oxidation, and then the exposed unmasked surface is oxidized to grow a thermal oxide which in effect sinks into the silicon surface at the unmasked areas. The masked silicon remains as a mesa surrounded by the sunken silicon dioxide or Field OXide pattern, FOX 12. Then semiconductor devices can be provided in the silicon mesas according to the following processes.

The surface of the silicon substrate 10 is thermally oxidized to form the desired gate dielectric silicon oxide 14 thickness. The preferred thickness is between about 80 to 200 Angstroms for devices with submicron feature sizes. The polysilicon layer 16 is blanket deposited by LPCVD (Low Pressure Chemical Vapor Deposition) method. The preferred thickness of the polysilicon layer 16 is between about 2000 to 5000 Angstroms. The polysilicon layer 16 is ion implanted or doped with phosphorus, arsenic, or boron to be a good conductor with sheet resistance of several or several tens ohms per square. a polycide structure is an alternative. The layers 14 and 16 are patterned by conventional lithography and anisotropic etching techniques as are conventional in the art to provide a desired pattern of gate electrodes/gate dielectric silicon oxide on the bare silicon device regions of substrate 10, the FOX 12 surfaces or elsewhere as seen in FIG. 1.

The source/drain structure of the MOS FET may now be formed by the following steps. FIG. 1 illustrates the formation of an N channel FET integrated circuit device. However, it is well understood by those skilled in the art that a P channel FET integrated circuit device could also be formed by simply substituting opposite polarities to those given for the N channel embodiment. Also, a CMOS FET could in a similar way be formed by making both N channel and P channel devices upon the same substrate.

FIG. 1, for example shows the ion implantations of N- dopants. Lithographic masks may be required to protect the areas not to be subjected to that particular N- ion implantation. The formation of the lithographic masks are done by conventional lithography and etching techniques. The N- lightly doped drain implantation 20 is done with, for example, 1E13 to 5E13 atoms/$cm_2$. This is a low-dose implantation so that charge damage is negligible.

The dielectric spacer 24 is now to be formed followed by the completion of the lightly doped drain source/drain structures. An undoped silicon dioxide or silicon nitride with a preferred thickness of between about 1000 to 4000 Angstroms is chemical vapor deposited and anisotropically etched to form the dielectric spacer. The thickness of the dielectric spacer 24 is between about 500 to 3000 Angstroms.

An anisotropic etching of this layer produces the dielectric spacer layer 24 on the sidewalls of the layer structures 14 and 16. The preferred anisotropic etching uses a conventional reactive ion etching ambient.

Figure 2:
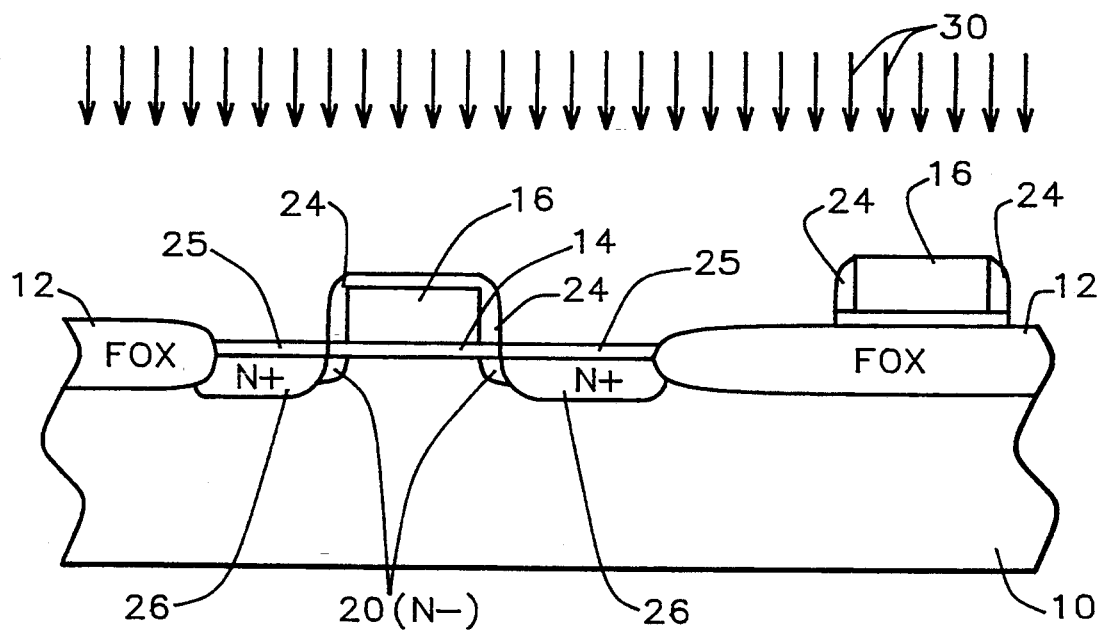
FIG. 2 is a cross-sectional representation of a conventional ion implantation process.

Referring now to FIG. 2, there is shown the same structures and layers as described above for FIG. 1, except that in the conventional process, a thin silicon oxide, silicon nitride or the like masking layer (25 in FIG. 2) is usually formed upon the layer structure regions 14 and 16, the spacers 24 and the exposed monocrystalline silicon substrate regions to protect the surfaces from damage contamination as well as channelling during high-dose ion implantation, 30. However, this layer does not protect the gate electrodes from electrical charge damage. Typically, an electron "flood gun" is used during ion implantation to neutralize the ions before their arrival. However, the "flood gun" cannot neutralize all ions and some charge damages occur.

Returning to FIG. 1, in the present invention, no silicon oxide or silicon nitride is used. Instead, a thin conducting layer 27 of titanium, titanium nitride, aluminum, or the like is sputter deposited over all surfaces. This conducting layer 27 has an operative thickness of between about 50 to 1000 Angstroms, with a preferred thickness of about 300 Angstroms. If the conducting layer is too thick, the energy of the subsequent ion implantation must be increased. If the layer is too thin, it would not be enough to conduct away the electrical charges. Also, the layer must not be so thin as to allow damage to the silicon surfaces. Further, the thickness must be sufficient to allow for the needed conductivity of the charge from the gate electrode to ground. The thickness of this conducting layer 27 also depends upon the particular conductor used. It can be thinner for aluminum or aluminum alloy for its high conductivity and must be thicker for titanium nitride. The sheet resistivities of titanium, titanium nitride, and aluminum are about 60, 80, and 3 micro-ohms/cm, respectively. The conducting layer 27 is grounded to the silicon substrate 10.

The N+ source/drain ion implantation, 30, uses phosphorus, arsenic, or antimony with a high-dose of between about 1E15 to 1E16 atoms/$cm.^2$ and energy of about 60 to 100 Kev. to complete the source/drain regions 26. All electrical charges are grounded through the conducting layer 27 to the substrate 10, resulting in a damage-free implantation process. The conductive layer 27 is needed where the ion implantation is greater than about 5E14 ions/$cm^2$ and energy is greater than about 30 Kev.

Conducting layer 27 is easily removed by dry etching or chemical dip etching. For example, titanium and titanium nitride can be removed by dipping the wafer in a solution of $NH_4OH:H_2O_2:H_2O$ in the concentration 1:1:5. A coating of aluminum can be removed by dipping the wafer in a solution of $H_2SO_4: H_2O_2$ in the concentration 5:1.

Further processing as is conventional in the art can continue to complete fabrication of the desired integrated circuit as is well known in the art.

This method using the conducting layer 27 can be used to protect device elements in and on the silicon substrate, in general during high-dose ion implantation. For example, other device elements which need this protection include the gate electrode, floating gate electrode, gate dielectric, and interpoly dielectric of an erasable programmable read only memory (EPROM), as a second preferred embodiment of the present invention illustrated in Fig. 3.

Figure 3:
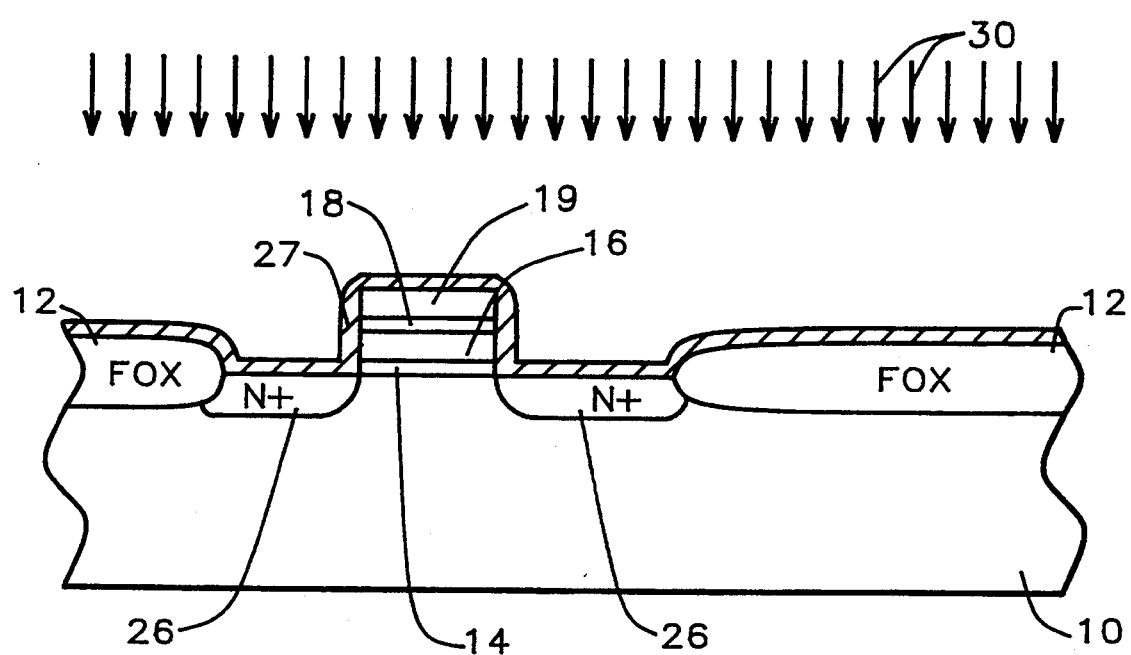
FIG. 3 is a cross-sectional representation of a second preferred embodiment of the present invention.

Referring now more particularly to FIG. 3, there is shown a semiconductor substrate 10, preferably composed of silicon having a (100) crystallographic orientation. As described above in the construction of the MOSFET in FIG. 1, dielectric isolation regions such as field oxide region 12 are formed. The surface of the silicon substrate 10 is thermally oxidized to form the desired gate dielectric silicon oxide 14 thickness. The preferred thickness is between about 80 to 200 Angstroms for devices with submicron feature sizes. The polysilicon layer 16 is blanket deposited by LPCVD (Low Pressure Chemical Vapor Deposition) method. The preferred thickness of the polysilicon layer 16 is between about 2000 to 5000 Angstroms. The polysilicon layer 16 is ion implanted or doped with phosphorus, arsenic, or boron to be a good conductor with sheet resistance of several or several tens ohms per square. The layers 14 and 16 are patterned by conventional lithography and anisotropic etching techniques as are conventional in the art to provide a desired pattern of gate electrodes/gate dielectric silicon oxide on the bare silicon device regions of substrate 10, the FOX 12 surfaces or elsewhere as seen in FIG. 1.

Next, the interlevel dielectric layer 18 is formed over the gate electrodes 16, followed by formation of a layer of active gate material such as polysilicon 19. The interpoly dielectric 18 may be composed of silicon dioxide, layers of silicon nitride and silicon oxide (NO), or layers of silicon oxide, silicon nitride, and silicon oxide (ONO) or any dielectric layer. These layers 18 and 19 are patterned as is conventional in the art and etched to complete formation of the floating gate electrode 19.

To protect the gate electrodes and gate dielectric regions during formation of the bit lines and word lines, a thin conducting layer 27 of titanium, titanium nitride, aluminum, or the like is sputter deposited over all surfaces. This conducting layer 27 has an operative thickness of between about 50 to 1000 Angstroms, with a preferred thickness of about 300 Angstroms. If the conducting layer is too thick, the energy of the subsequent ion implantation must be increased. If the layer is too thin, it would not be enough to conduct away the electrical charges. Also, the layer must not be so thin as to allow damage to the silicon surfaces. Further, the thickness must be sufficient to allow for the needed conductivity of the charge from the gate electrode to ground. The thickness of this conducting layer 27 also depends upon the particular conductor used. As stated above, it can be thinner for aluminum or aluminum alloy for its high conductivity and must be thicker for titanium nitride. The sheet resistivities of titanium, titanium nitride, and aluminum are about 60, 80, and 3 micro-ohms/cm, respectively. The conducting layer 27 is grounded to the silicon substrate 10.

The buried N+ diffusions 26 to create the bit lines and word lines can now be performed. All electrical charges are grounded through the conducting layer 27 to the substrate 10, resulting in a damage-free implantation process. The conductive layer 27 is needed where the ion implantation is greater than about 5E14 ions/cm$^2$.

Conducting layer 27 is easily removed by dry etching or chemical dip etching. For example, titanium and titanium nitride can be removed by dipping the wafer in a solution of $NH_4OH:H_2O_2:H_2O$ in the concentration 1:1:5. A coating of aluminum can be removed by dipping the wafer in a solution of $H_2SO_4:H_2O_2$ in the concentration 5:1.

Further processing as is conventional in the art can continue to complete fabrication of the desired EPROM integrated circuit as is well known in the art.

While the invention has been particularly shown and described with reference to the preferred embodiments thereof, it will be understood by those skilled in the art that various changes in form and details may be made without departing from the spirit and scope of the invention.

What is claimed is:

1. The method of manufacture of an integrated circuit comprising:
   providing, on a silicon substrate, a pattern of silicon gate electrodes over a gate dielectric;
   depositing a thin conducting layer superadjacent to said pattern of gate electrodes and providing means to ground said conducting layer to said substrate; and
   performing high-dose ion implantation through said conducting layer to form implanted regions underlying said conducting layer wherein said conducting layer grounds all electric charge resulting from said ion implantation whereby said gate electrodes and said gate dielectric are protected from charge damage during said ion implantation in the manufacture of said integrated circuit.

2. The method of claim 1 wherein said integrated circuit contains MOS FET devices.

3. The method of claim 1 wherein said integrated circuit contains EPROM devices and wherein the floating gate and interpoly oxide of said EPROM devices are also protected from charge damage.

4. The method of claim 1 wherein said conducting layer is composed of titanium.

5. The method of claim 4 wherein said conducting layer is completely removed after said ion implantation by a chemical etching process wherein the active ingredients are sulfuric acid and hydrogen peroxide.

6. The method of claim 1 wherein said conducting layer is composed of titanium nitride.

7. The method of claim 6 wherein said conducting layer is completely removed after said ion implantation by a chemical etching process.

8. The method of claim 1 wherein said conducting layer is composed of aluminum.

9. The method of claim 8 wherein said conducting layer is completely removed after said ion implantation by a chemical etching process wherein the active ingredients are sulfuric acid and hydrogen proxide.

10. The method of claim 1 wherein said conducting layer is deposited to a thickness of between about 100 to 1000 Angstroms.

11. The method of claim 1 wherein said conducting layer is completely removed after said ion implantation by a chemical etching process.

12. The method of claim 1 wherein said ion implantation dosage is greater than about 5E14 ions/cm$^2$ and energy applied is greater than about 30 Kev.

13. The method of manufacture of an integrated circuit comprising:
    providing, on and in a silicon substrate, a pattern of device elements;
    depositing a thin conducting layer directly over said pattern of said device elements and providing to said conducting layer a ground to said substrate;
    performing high-dose ion implantation through said conducting layer to form implanted regions underlying said conducting layer wherein said conducting layer grounds all electric charge resulting from said ion implantation to said substrate whereby said device elements are protected from charge damage during said ion implantation; and
    removing said conductive layer.

14. The method of claim 13 wherein said conducting layer is composed of titanium and has a thickness of between about 50 to 1000 Angstroms.

15. The method of claim 14 wherein said conducting layer is completely removed after said ion implantation by a chemical etching process wherein the active ingredient is ammonia.

16. The method of claim 13 wherein said conducting layer is composed of titanium nitride and has a thickness of between about 50 to 1000 Angstroms.

17. The method of claim 16 wherein said conducting layer is completely removed after said ion implantation by a chemical etching process.

18. The method of claim 13 wherein said conducting layer is composed of aluminum alloy and has a thickness of between about 50 to 1000 Angstroms.

19. The method of claim 18 wherein said conducting layer is completely removed after said ion implantation by a chemical etching process wherein the active ingredients are sulfuric acid and hydrogen peroxide.

20. The method of claim 13 wherein said device elements include silicon gate electrodes over a gate dielectric and wherein said ion implantation forms source-/drain regions using said gate electrodes as a mask by said ion implantation.

21. The method of claim 13 wherein said device elements include gate electrodes, floating gate electrodes, gate dielectric, and interpoly oxide dielectric of an EPROM device and wherein said ion implantation forms bit lines and word lines using said gate electrodes as mask by said ion implantation.

22. The method of claim 13 wherein said ion implantation dosage is greater than about $5E14\ cm^2$ and energy applied is greater than about 30 Kev.

23. The method of manufacture of an erasable-programmable read only memory (EPROM) integrated circuit comprising:

providing, on a silicon substrate, a pattern of silicon gate electrodes over a gate dielectric and further providing an interpoly oxide dielectric layer over said silicon gate electrodes and providing floating gate electrodes over said interpoly oxide dielectric;

depositing a thin conducting layer superadjacent to said pattern of floating gate electrodes and providing means to ground said conducting layer to said substrate; and performing high-dose ion implantation through said conducting layer to form implanted regions underlying said conducting layer wherein said conducting layer grounds all electric charge resulting from said ion implantation whereby said floating gate electrodes, said interpoly oxide dielectric, said silicon gate electrodes, and said gate dielectric are protected from charge damage during said ion implantation in the manufacture of said EPROM integrated circuit.

24. The method of claim 23 wherein said conducting layer is composed of titanium and has a thickness of between about 50 to 1000 Angstroms.

25. The method of claim 23 wherein said conducting layer is composed of titanium nitride and has a thickness of between about 50 to 1000 Angstroms.

26. The method of claim 23 wherein said conducting layer is composed of aluminum and has a thickness of between about 50 to 1000 Angstroms.

* * * * *